(12) United States Patent
Tai et al.

(10) Patent No.: US 12,538,573 B2
(45) Date of Patent: Jan. 27, 2026

(54) ELECTRONIC DEVICE

(71) Applicant: InnoLux Corporation, Miao-Li County (TW)

(72) Inventors: Ming-Jou Tai, Miao-Li County (TW); Chia-Hao Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 394 days.

(21) Appl. No.: 18/123,339

(22) Filed: Mar. 20, 2023

(65) Prior Publication Data
US 2023/0335562 A1 Oct. 19, 2023

Related U.S. Application Data

(60) Provisional application No. 63/330,320, filed on Apr. 13, 2022.

(30) Foreign Application Priority Data

Jan. 9, 2023 (CN) .......................... 202310024199.0

(51) Int. Cl.
*H10D 86/40* (2025.01)
*H10D 30/67* (2025.01)

(52) U.S. Cl.
CPC ....... *H10D 86/421* (2025.01); *H10D 30/6715* (2025.01); *H10D 30/6757* (2025.01)

(58) Field of Classification Search
CPC ............. H10D 86/421; H10D 30/6715; H10D 30/6757
See application file for complete search history.

(56) References Cited

U.S. PATENT DOCUMENTS

| | | | |
|---|---|---|---|
| 2002/0149711 A1 | 10/2002 | Yamazaki | |
| 2005/0012100 A1* | 1/2005 | Koo | H10D 30/6715 257/72 |
| 2010/0109009 A1* | 5/2010 | Noda | H10D 30/6715 257/59 |
| 2016/0254276 A1* | 9/2016 | Tada | H10D 86/421 257/72 |
| 2017/0062477 A1* | 3/2017 | Su | H10D 86/421 |
| 2020/0285090 A1* | 9/2020 | Tanaka | G02F 1/1368 |
| 2021/0367081 A1 | 11/2021 | Yan | |
| 2023/0099536 A1* | 3/2023 | Yu | H10D 86/421 349/42 |

FOREIGN PATENT DOCUMENTS

| | | |
|---|---|---|
| CN | 1146058 | 4/2004 |
| TW | 200729511 | 8/2007 |

* cited by examiner

*Primary Examiner* — Peter M Albrecht
(74) *Attorney, Agent, or Firm* — Winston Hsu (57) ABSTRACT

An electronic device includes a substrate, a data line disposed on the substrate, a drain disposed on the substrate and a semiconductor layer disposed on the substrate. The semiconductor layer includes a first portion connected to the data line, a second portion connected to the drain, and a third portion connected between the first portion and the second portion. At least one portion of the third portion includes at least one of IIIA group element and VA group element, and the doping concentration of the at least one of IIIA group element and VA group element is greater than 0 and less than or equal to $10^{16}$ atoms/cm$^3$.

16 Claims, 10 Drawing Sheets

ELECTRONIC DEVICE

CROSS REFERENCE TO RELATED APPLICATION

This application claims the benefit of U.S. Provisional Application No. 63/330,320, filed on Apr. 13, 2022. The content of the application is incorporated herein by reference.

BACKGROUND OF THE DISCLOSURE

1. Field of the Disclosure

The present disclosure relates to an electronic device, in particular to an electronic device including a semiconductor layer.

2. Description of the Prior Art

As the technology improves, electronic devices have become indispensable items in modern people's lives. Electronic devices usually include driving elements and/or switch elements, and the manufacturing space of the semiconductor layers in the driving elements and switch elements may be reduced due to the increase of resolution, thus causing the width variation of the semiconductor layers and affecting their performance.

On the other hand, when the resolution of the electronic device is increased, the distance between elements is reduced accordingly, such that the design of contact hole in the prior art may lead to an unexpected expose of conductive layer in the manufacturing process thereof, resulting in a short circuit between elements.

Therefore, electronic device manufacturers need to provide better design of device configuration to ameliorate the defects such as insufficient aperture ratio and short circuit caused by reduction of element size and manufacturing factors in the prior art.

SUMMARY OF THE DISCLOSURE

One objective of the present disclosure is to provide an electronic device.

Some embodiments of the present disclosure provide an electronic device including a substrate, a data line disposed on the substrate, a drain disposed on the substrate and a semiconductor layer disposed on the substrate. The semiconductor layer includes a first portion connected to the data line, a second portion connected to the drain, and a third portion connected between the first portion and the second portion. At least one portion of the third portion includes at least one of IIIA group element and VA group element, and the doping concentration of the at least one of IIIA group element and VA group element is greater than 0 and less than or equal to $10^{\wedge}16$ ($10^{16}$) atoms/cm$^3$.

Some embodiments of the present disclosure provide an electronic device including a substrate, a data line disposed on the substrate, a drain disposed on the substrate, a scan line disposed on the substrate, and a semiconductor layer disposed on the substrate. The data line extends along a first direction, and the scan line extends along a second direction, wherein the second direction is different from the first direction. The semiconductor layer includes a first portion connected to the data line, a second portion connected to the drain, and a third portion connected between the first portion and the second portion. The third portion overlaps the scan line. At least one portion of the third portion includes at least one of IIIA group element and VA group element, and the doping concentration of the at least one of IIIA group element and VA group element is greater than 0 and less than or equal to $10^{\wedge}16$ ($10^{16}$) atoms/cm$^3$.

These and other objectives of the present disclosure will no doubt become obvious to those of ordinary skill in the art after reading the following detailed description of the embodiment that is illustrated in the various figures and drawings.

DETAILED DESCRIPTION

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and following claims to refer to particular elements. Those skilled in the art should understand that electronic equipment manufacturers may refer to an element by different names. This document does not intend to distinguish between elements that differ in name but not function.

In the following description and claims, the terms "include", "comprise" and "have" are used in an open-ended fashion, and thus should be interpreted to mean "include, but not limited to . . . ". When the terms "include", "comprise" and/or "have" are used in this specification, they specify the presence of the features, regions, steps, operations and/or elements, but do not exclude the presence or addition of one or more other features, regions, steps, operations, elements and/or combinations thereof.

Ordinal numbers such as "first" and "second" in the specification and claims are used to distinguish/describe the elements in the claims. It does not mean that the claimed element has any previous ordinal numbers, nor does it mean the order of a certain element and another element, or the order in manufacturing method. The ordinal number is just used to make a claimed element with a certain name be clearly distinguishable from another claimed element with the same name.

Spatially relative terms, such as "above", "under", "left", "right", "front", "behind" and the like, used in the following embodiments just refer to the directions in the drawings and are not intended to limit the present disclosure. It should be understood that the elements in the drawings may be disposed in any kind of formation known by one skilled in the related art to describe the elements in a certain way.

In addition, when an element or layer is described as being on or above another element or layer, it should be understood that the element or layer is directly on the another element or layer, and alternatively, another element or layer may be between the element or layer and the another element or layer (indirectly). On the contrary, when the element or layer is described as being directly on the another element or layer, it should be understood that there is no intervening element or layer between them. When an element is electrically connected or coupled to another element, it may include the case that there may be conductive lines or passive components (e.g. resistor, capacitor, etc.) between the element and the another element to electrically connect them. No other electrical component between the element and the another element.

In this disclosure, the thickness, length and width may be measured by optical microscopy (OM), and the thickness or length may be measured by scanning electron microscope (SEM), but not limited thereto. The doping concentration of dopant may be measured by SEM, transmission electron microscope (TEM), X-ray photoelectron spectroscopy (XPS), energy-dispersive X-ray spectroscopy (EDS) or secondary ion mass spectrometer (SIMS), but not limited thereto. In addition, any two values or directions used for comparison may have certain errors.

In the specification, the terms "approximately", "about", "substantially", "roughly", and "same" generally mean within 10%, 5%, 3%, 2%, 1%, or 0.5% of the reported numerical value or range. The quantity disclosed herein is an approximate quantity, that is, without a specific description of "approximately", "about", "substantially", "roughly", and "same", the quantity may still include the meaning of "approximately", "about", "substantially", "roughly", and "same".

The electronic device in the present disclosure may include, but is not limited to, a display device, a light-emitting device, a backlight device, a virtual reality (VR) device, an antenna device, a sensing device or a splicing device. The electronic device may be a bendable or flexible electronic device. The display device may be a non-self-luminous display device or a self-luminous display device. The antenna device may be a liquid crystal antenna device or a non-liquid-crystal antenna device, and the sensing device may be a sensing device for sensing capacitance, light, heat energy or ultrasonic waves, but not limited thereto. Electronic devices may include passive components and active components, such as capacitors, resistors, inductors, diodes and transistors. Diodes may include light emitting diodes or photodiodes. The light-emitting diode may include, for example, an inorganic light emitting diode, an organic light emitting diode (OLED), a mini LED, a micro LED or a quantum dot LED, but not limited thereto. The tiled device may be, for example, a display tiled device or an antenna tiled device, but not limited thereto. It should be noted that the electronic device may be any combination as mentioned above, but not limited thereto. In addition, the display device may be, for example, in a shape of rectangular, circular, polygonal, a shape with curved edges, a curved surface, or other suitable shapes. An electronic device may have a peripheral system such as a drive system, a control system, a light source system to support a display device, an antenna device, a wearable device (e.g. including augmented reality or virtual reality), a vehicle-mounted device (e.g. including vehicle windshield) or a tiled device.

It should be noted that in the following embodiments, the technical features of several different embodiments may be disassembled, replaced, recombined and mixed to complete other examples without departing from the spirit of the present disclosure.

Figure 1A:
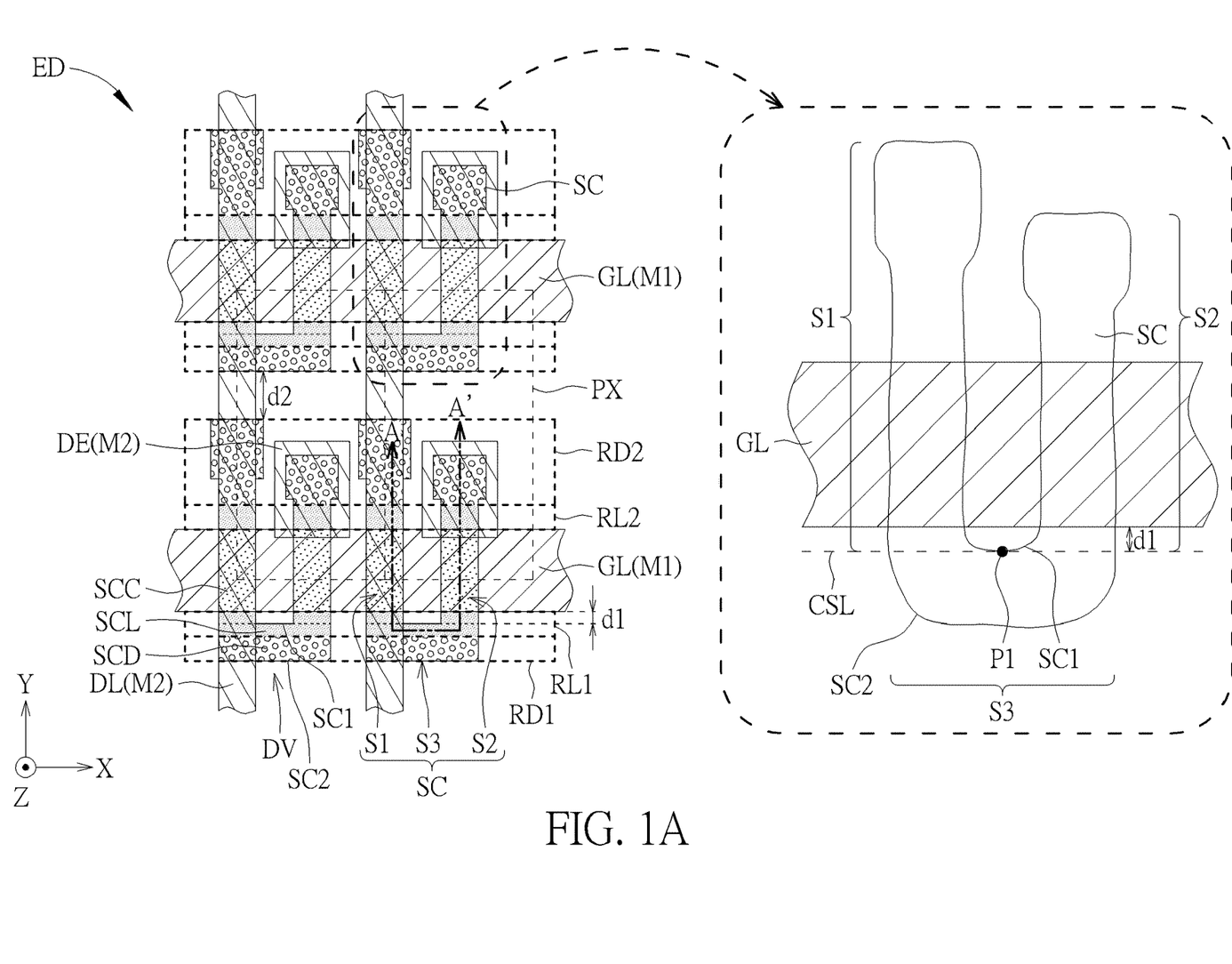
FIG. 1A is a schematic partial top view of the electronic device according to a first embodiment of the present disclosure.
Figure 2:
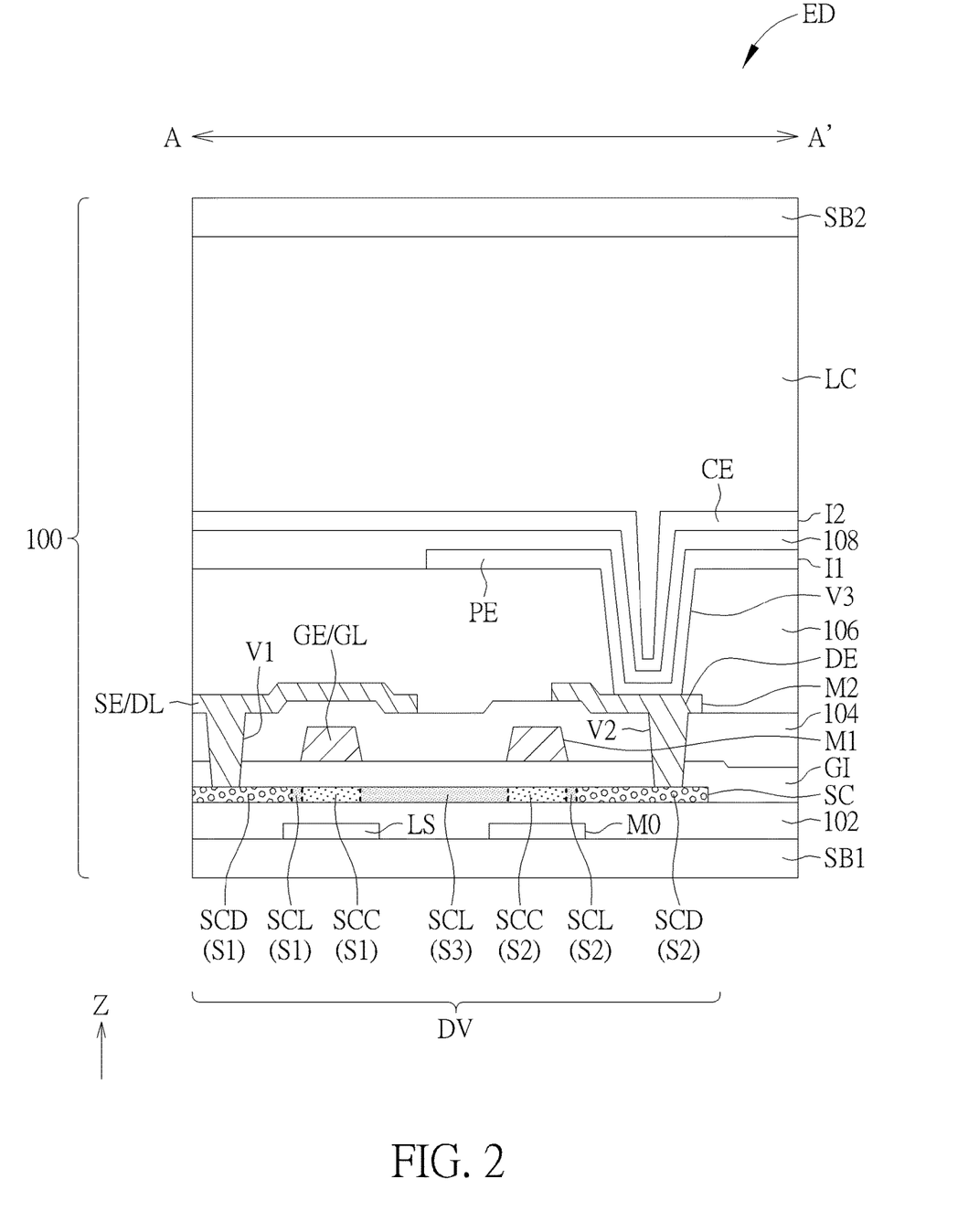
FIG. 2 is a schematic partial cross-sectional view of the electronic device along line A-A' of FIG. 1A of the present disclosure.

Referring to FIG. 1A and FIG. 2, FIG. 1A is a schematic partial top view of the electronic device according to the first embodiment of the present disclosure, and FIG. 2 is a schematic partial cross-sectional view of the electronic device along line A-A' of FIG. 1A of the present disclosure. In this embodiment, the electronic device ED includes, but is not limited to, a display panel 100 for displaying images or pictures. In other embodiments, the electronic device ED may be any device with driving elements, switch elements and/or thin film transistors. The electronic device ED includes a substrate SB1, at least one data line DL, at least one drain DE and a semiconductor layer SC, wherein the data line DL, the drain DE and the semiconductor layer SL are disposed on the substrate SB1. The electronic device ED may further include a scan line GL disposed on the substrate SB1. The scan line GL may extend along the first direction X and overlap at least a portion of the semiconductor layer SC, and the data line DL may extend along the second direction Y, wherein the first direction X is not parallel to the second direction Y. In this embodiment, the first direction X is perpendicular to the second direction Y as an example, but not limited thereto. In some embodiments, a plurality of data lines DL and a plurality of scan lines GL may be formed on the substrate SB1, which intersect with each other to define a plurality of pixel areas PX (or sub-pixel areas) arranged in an array, and only two complete pixel areas PX are shown schematically in FIG. 1A.

In some embodiments, each pixel area PX may include a corresponding driving element DV. For example, the driving element DV is a thin film transistor. In some embodiments, the driving element DV may be replaced by a switch element. The driving element DV includes a source SE, a drain DE, a gate GE and a semiconductor layer SC. The source SE may be a portion of the data line DL, and the gate GE may be a portion of the scan line GL. The semiconductor layer SC may have an U-shaped pattern and include a first portion S1 connected to the data line DL (i.e., the source SE), a second portion S2 connected to the drain DE, and a third portion S3 connected between the first portion S1 and the second portion S2. In detail, the extending direction of the patterns of the first portion S1 and the second portion S2 of the semiconductor layer SC may be approximately parallel to the extending direction of the data line DL (i.e. the second direction Y), while the extending direction of the pattern of the third portion S3 may be approximately parallel to the extending direction of the scan line GL (i.e. the first direction X). In FIG. 1A, the third portion S3 extends left and right to the lower sides of the first portion S1 and the second portion S2 along the first direction X to connect to the lower ends of the first portion S1 and the second portion S2. In other words, in a simpler definition, the lower portion of the U-shaped pattern of the semiconductor layer SC that extends horizontally along the first direction X may be regarded as the third portion S3, while the portions of the U-shaped pattern that extends longitudinally along the second direction Y may be regarded as the first portion S1 and the second portion S2, wherein the lower parts thereof are connected to the upper sides of the left and right ends of the third portion S3. Referring to the partially enlarged schematic diagram of the semiconductor layer SC and the scan line GL on the right side of FIG. 1A. When the patterned semiconductor layer SC is manufactured by photolithography-etching process, the actually formed pattern of the semiconductor layer SC may have non-linear edges (e.g., including rounded corners and curved edges). According to the embodiment shown in FIG. 1A, a more specific definition of the third portion S3 of the present disclosure may be, for example, that the point of the inner edge SC1 of the semiconductor layer SC farthest from the scan line GL near the turning point of the U-shaped pattern is defined as a saddle point P1, a reference line CSL extending along the first direction X and passing through the saddle point P1 may be defined, and the portion of the semiconductor layer SC below the reference line CSL is defined as the third portion S3 of the semiconductor layer SC of the present disclosure. The left portion of the semiconductor layer SC above the reference line CSL (i.e., the portion electrically connected to the data line DL) is defined as the first portion S1 of the semiconductor layer SC, and the right portion of the semiconductor layer SC above the reference line CSL (i.e., the portion electrically connected to the drain DE) is defined as the second portion S2 of the semiconductor layer SC. In the top view of the present disclosure shown in FIG. 1A, the "upper side" refers to the side pointing along the second direction Y, the "lower side" refers to the opposite side pointing along the second direction Y, the "right side" refers to the side pointing along the first direction X, and the "left side" refers to the opposite side pointing along the first direction X, which are the same for other subsequent embodiments and are not repeated again.

As shown in FIG. 2, the semiconductor layer SC may be divided into undoped regions SCC, lightly doped regions SCL and heavily doped regions SCD depending on the doping concentration. The undoped regions SCC may serve as the channel regions of the driving element DV, which substantially correspond to the gate GE. That is, the portions of the semiconductor layer SC correspondingly disposed under the scan line GL is the undoped regions SCC. The lightly doped regions SCL may be also called light doped drains (LDD), and the doping concentration thereof is greater than 0 and less than or equal to $10^{16}$ atoms/cm$^3$, or $10^{10}$ to $10^{16}$ atoms/cm$^3$, but not limited thereto. For example, the lightly doped regions SCL may be doped with at least one of IIIA group element and VA group element, such as at least one of boron (B), aluminum (Al), gallium (Ga), indium (In), phosphorus (P), arsenic (As), antimony (Sb), etc., but not limited thereto. The doping concentration of the heavily doped regions SCD is greater than $10^{16}$ atoms/cm$^3$, and the heavily doped regions SCD may be doped with at least one of IIIA group element and VA group element. The dopants are exemplified above and will not be described in detail. For example, the doping concentration of the dopant may be obtained by analysis or measurement by SEM, TEM, XPS, EDS, SIMS. Please refer to FIG. 2 and FIG. 1A at the same time. The heavily doped region SCD electrically connected to the source SE may serve as a source region in the semiconductor layer SC, which is located at the upper left side of the U-shaped semiconductor layer SC, but not limited thereto. A lightly doped region SCL may be provided between the heavily doped region SCD serving as the source region and the undoped region SCC serving as the channel region. Furthermore, the heavily doped region SCD electrically connected to the drain DE may serve as a drain region in the semiconductor layer SC, which is located at the upper right side of the U-shaped semiconductor layer SC, but not limited thereto. A lightly doped region SCL may be provided between the heavily doped region SCD serving as the drain region and the undoped region SCC serving as the channel region. By disposing the lightly doped region SCL with transitional effect between the heavily doped region SCD and the undoped region SCC, the damage of the semiconductor layer SCC may be reduced.

According to the present disclosure, the third portion S3 of the semiconductor layer SC is located between the gates GE, and at least a portion of the third portion S3 is a lightly doped region SCL. Specifically, when manufacturing the semiconductor layer SC, setting regions are set on the substrate SB1 according to predetermined doping concentrations, and doping processes are performed to the semiconductor layer SC corresponding to the setting regions. The above setting regions include, for example, lightly doped predetermined regions RL1, lightly doped predetermined regions RL2, heavily doped predetermined regions RD1 and heavily doped predetermined regions RD2, which may extend across a plurality of driving elements DV along the first direction X. That is, they are parallel to the scan line GL. As shown in FIG. 1A, one driving element DV may correspond to two lightly doped predetermined regions RL1 and RL2 and two heavily doped predetermined regions RD1 and RD2. The lightly doped predetermined region RL1 corresponds to the lower portion of the driving element DV. In the embodiment shown in FIG. 1A, the upper boundary of the lightly doped predetermined region RL1 may be substantially aligned with the lower edge of the scan line GL, and the lower boundary of the lightly doped predetermined region RL1 may be located between the inner edge SC1 and the outer edge SC2 of the third portion S3 of the semiconductor layer SC (in the second direction Y). The portion of the semiconductor layer SC corresponding to the lightly doped predetermined region RL1 may define a lightly doped region SCL located between two undoped regions SCC. The upper boundary of the heavily doped predetermined region RD1 overlaps the lower boundary of the lightly doped predetermined region RL1, and the lower boundary of the heavily doped predetermined region RD1 may be aligned with the outer edge SC2 of the third portion S3 of the semiconductor layer SC, but not limited thereto. The portion of the semiconductor layer SC corresponding to the heavily doped predetermined region RD1 may define a heavily doped region SCD located between two undoped regions SCC. Therefore, the upper portion of the third portion S3 of the semiconductor layer SC includes the lightly doped region SCL, and the lower portion of the third portion S3 includes the heavily doped region SCD. In other words, at least a portion of the third portion S3 is a lightly doped region SCL, that is, it includes at least one of IIIA group element and VA group element, and the doping concentration of the at least one of IIIA group element and VA group element is greater than 0 and less than or equal to $10^{16}$ atoms/cm$^3$.

Furthermore, the heavily doped predetermined region RD2 corresponds to the upper portion of the driving element DV. In the top view of the structure of the embodiment shown in FIG. 1A, that is, in the top view direction of the substrate SB1 (i.e., the normal direction Z of the substrate), the upper boundary of the heavily doped predetermined region RD2 is, but not limited to, aligned with the upper edge of the semiconductor layer SC, and the lower boundary is, but not limited to, located at the upper side of the lower edge of the drain DE or the upper side of the scan line GL. The portions of the semiconductor layer SC corresponding to the heavily doped predetermined region RD2 may respectively define a heavily doped region SCD as a source region and a heavily doped region SCD as a drain region. The lightly doped predetermined region RL2 is located between the heavily doped predetermined region RD2 and the scan line GL, the upper boundary of the lightly doped predetermined region RL2 may overlap the lower boundary of the heavily doped predetermined region RD2, and the lower boundary of the lightly doped predetermined region RL2 may overlap the upper edge of the scan line GL. The portions of the semiconductor layer SC corresponding to the lightly doped predetermined region RL2 may define the lightly doped regions SCL between the undoped regions SCC and the heavily doped regions SCD. As shown in FIG. 1A, the semiconductor layer SC in one driving element DV includes three lightly doped regions SCL separated from each other. One of the three lightly doped regions SCL and the other two of the tree lightly doped regions SCL are disposed at two opposite sides of the scan line GL.

In the embodiment shown in FIG. 1A, the third portion S3 of the semiconductor layer SC has an inner edge SC1 closer to the scan line GL, and a "maximum distance" between the inner edge SC1 and the scan line GL is more than 0 μm and less than or equal to 5 μm. The maximum distance is represented by distance d1 between the inner edge SC1 and the scan line GL in FIG. 1A (i.e., 0 μm<d1≤5 μm), and the maximum distance may refer to the distance between the saddle point P1 and the lower edge of the scan line GL in the second direction Y that is perpendicular to the extending direction of the scan line GL. Since the saddle point P1 is the point where the inner edge SC1 of the third portion S3 is farthest from the lower edge of the scan line GL, the distance d1 between the inner edge SC1 of the third portion S3 and the lower edge of the scan line GL is less than or equal to the above-mentioned range of the maximum distance. For example, the distance d1 may be 1 μm, 2 μm, 3 μm, 4 μm or 5 μm, but the actual value is not limited to the above examples. According to the present disclosure, when the distance between the third portion S3 and the scan line GL is within the above range (e.g., less than or equal to 5 μm), it means that the turning point of the semiconductor layer SC with the U-shaped pattern (i.e., the third portion S3) is closer to the scan line GL, such that the distance d2 between the semiconductor layers SC of different adjacent pixels PX at the upper and lower sides is greater. This design may increase the aperture ratio of the pixel PX and the ratio of the light-emitting area/display area to area of the pixel PX. For example, when the display device ED is applied to a high-resolution product, the size of the pixel PX thereof is smaller (e.g., the distance between adjacent scan lines GL is less than 30 μm), and when the semiconductor layer SC is made of a material with high carrier mobility (e.g., low temperature polysilicon (LTPS) material), since the lightly doped region SCL is included in the third portion S3 (or the turning point of the semiconductor layer SC), the aperture ratio of the pixel PX may be improved, while the charge efficiency of the pixel PX is not significantly affected.

Referring to FIG. 2, the configuration of elements in the electronic device ED of the present disclosure is further described below. A patterned light shielding layer M0, an insulating layer 102, a patterned semiconductor layer SC, an insulating layer GI, a patterned first conductive layer M1, an insulating layer 104, a patterned second conductive layer M2, an insulating layer 106, a patterned third conductive layer I1, an insulating layer 108 and a fourth conductive layer I2 may be sequentially disposed on the substrate SB1. The substrate SB1 may include a hard substrate or a flexible substrate, but not limited thereto. The material of the substrate SB1 may include, for example, glass, quartz, sapphire, ceramic, polyimide (PI), polycarbonate (PC), polyethylene terephthalate (PET), other suitable materials or a combination of the above materials. For example, the light shielding layer M0 may include a metal layer or any material with light shielding function, and the pattern thereof may at least correspond to the patterns of the gates GE to form a plurality of light shielding elements LS. For example, the width of the light shielding element LS may be slightly greater than the width of the gate GE, but not limited thereto. The semiconductor layer SC may include any suitable semiconductor material (e.g., including silicon or metal oxide) such as low temperature polycrystalline silicon semiconductor, amorphous silicon (a-Si) semiconductor, indium gallium zinc oxide (IGZO) semiconductor or other suitable semiconductor, but not limited thereto. The semiconductor layer SC of this embodiment takes a semiconductor material including low temperature polysilicon as an example. The patterned first conductive layer M1 may form the gate GE and the scan line GL. The patterned second conductive layer M2 may form the source SE, the data line DL and the drain DE, wherein the source SE may contact and electrically connect to the heavily doped region SCD as the source region through the contact hole V1 in the insulating layer 104 and the insulating layer GI, and the drain DE may contact and electrically connect to the heavily doped region SCD as the drain region through the contact hole V2 in the insulating layer 104 and the insulating layer GI. The insulating layer 106 is disposed on the data line DL and includes a contact hole V3, which exposes a portion of the drain DE. The third conductive layer I1 constitutes a transparent electrode PE (e.g., as a pixel electrode), which may contact and electrically connect to the drain DE through the contact hole V3. In the normal direction Z, the contact hole V3 may or may not overlap the light shielding layer M0. A portion of the insulating layer 108 and a portion of the fourth conductive layer I2 may be disposed in the contact hole V3, and the insulating layer 108 is located between the fourth conductive layer I2 and the third conductive layer I1, such that the fourth conductive layer I2 and the transparent electrode PE in the contact hole V3 are insulated from each other. In this embodiment, the portion of the fourth conductive layer I2 disposed on the upper side of the transparent electrode PE may serve as a common electrode CE, but not limited thereto. The first conductive layer M1 and the second conductive layer M2 may individually include metal materials, wherein the metal materials include, for example, aluminum, molybdenum, copper, titanium, other suitable materials or a combination of at least two of the above, but not limited thereto. The insulating layer 102, the insulating layer GI, the insulating layer 104, the insulating layer 106 and the insulating layer 108 may include inorganic or organic insulating materials. Inorganic materials may include, for example, silicon oxide (SiOx), silicon nitride (SiN), silicon oxynitride (SiOxNy) or other suitable materials or a combination of the above materials, but not limited thereto. For example, the insulating layer 106 may include an organic material and serve as a planarization layer. The insulating layer 108 may include an inorganic material and serve as a passivation layer, but not limited thereto.

Furthermore, when the electronic device ED is applied as a display device and includes the display panel 100, the display panel 100 may further include another substrate SB2 and a display medium layer LC, wherein the display medium layer LC is located between the substrate SB2 and the substrate SB1. The display medium layer LC includes, for example, a liquid crystal layer, but not limited thereto. The surface of the substrate SB2 may be additionally provided with a patterned light shielding layer, a color filter layer and/or an optical conversion layer (not shown), but not limited thereto. In addition, polarizers (not shown) may be disposed on the surfaces of the substrate SB2 and the substrate SB1, and spacers (not shown) may be disposed between the substrate SB2 and the substrate SB1, but not limited thereto.

Figure 1B:
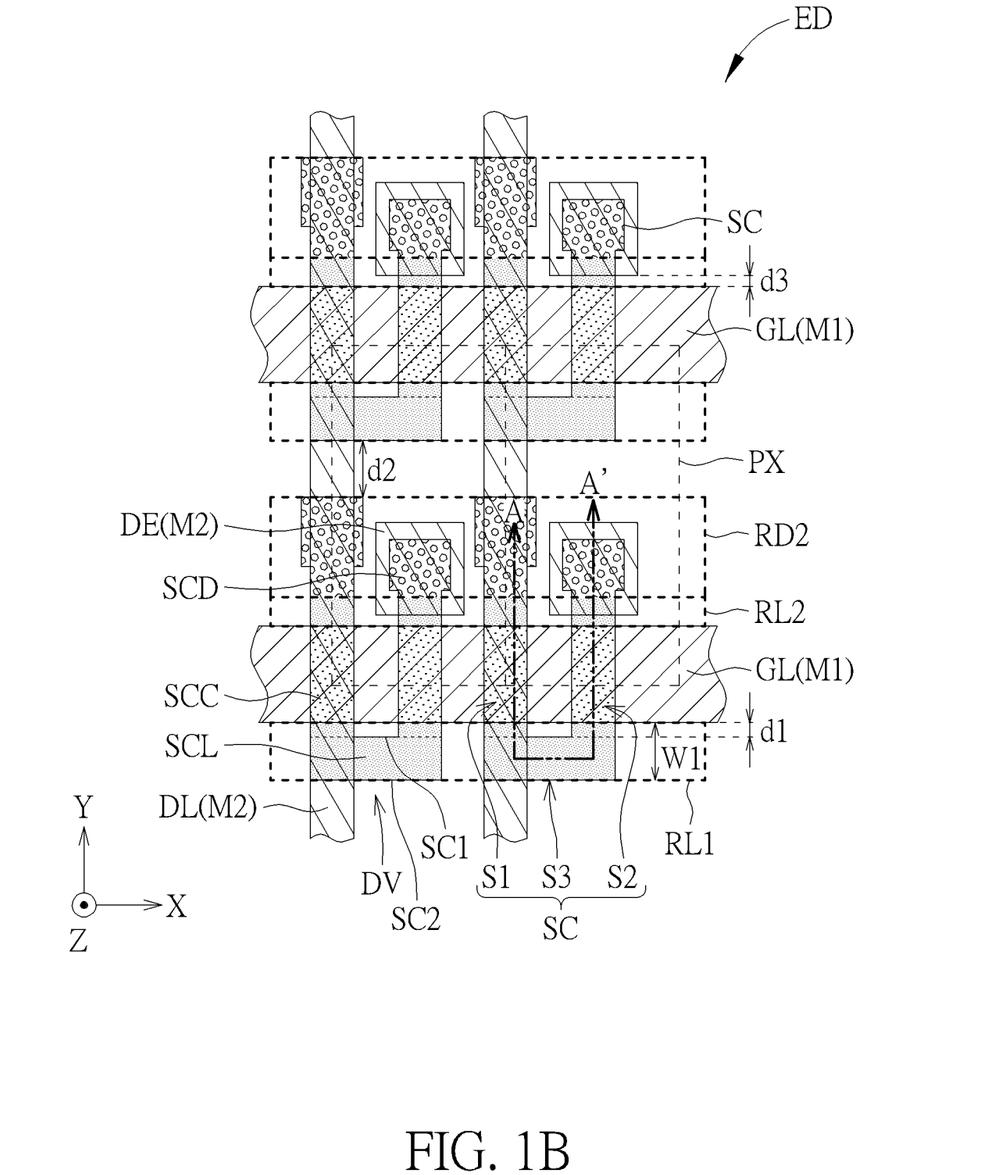
FIG. 1B is a schematic partial top view of a variation of the electronic device according to the first embodiment of the present disclosure.

Referring to FIG. 1B, FIG. 1B is a schematic partial top view of a variation embodiment of the electronic device according to the first embodiment of the present disclosure. The difference between the electronic device ED shown in FIG. 1B and the electronic device in FIG. 1A is that the heavily doped predetermined region RD1 shown in FIG. 1A may not be set at the lower side of the scan line GL, and the lightly doped predetermined region RL1 may have a greater width W1, such that the whole third portion S3 is located in the lightly doped predetermined region RL1. In other words, the entire of the third portion S3 is a lightly doped region SCL, and the portion of the semiconductor layer SC located between two undoped regions SCC (or between two gates GE) does not have the heavily doped region SCD. The relative positions of the undoped regions SCC, the heavily doped regions SCD and the lightly doped regions SCL in the semiconductor layer SC corresponding to line A-A' in FIG. 1B may be referred to FIG. 2, so they are not repeated in detail. Furthermore, in the variation embodiment shown in FIG. 1B, the lower edge of the drain DE and the upper edge of the scan line GL may optionally have a distance d3. That is, the drain DE may not overlap the scan line GL. In the variation embodiment of FIG. 1B, the inner edge SC1 of the third portion S3 and the lower edge of the scan line GL still has a distance d1, and the maximum value thereof may be greater than 0 μm and less than or equal to 5 μm.

The disclosed electronic device is not limited to the above embodiments. Other embodiments or variations of the present disclosure are disclosed below. In order to simplify the explanation and highlight the differences between the embodiments or variations, the same reference numerals are used to denote the same elements below, and the same portions are not repeated. In addition, in the subsequent embodiments of the present disclosure, the material of each film and the conditions of manufacturing processes (e.g., doping concentration of dopant) may refer to the first embodiment, so they are not repeated in detail.

Figure 3A:
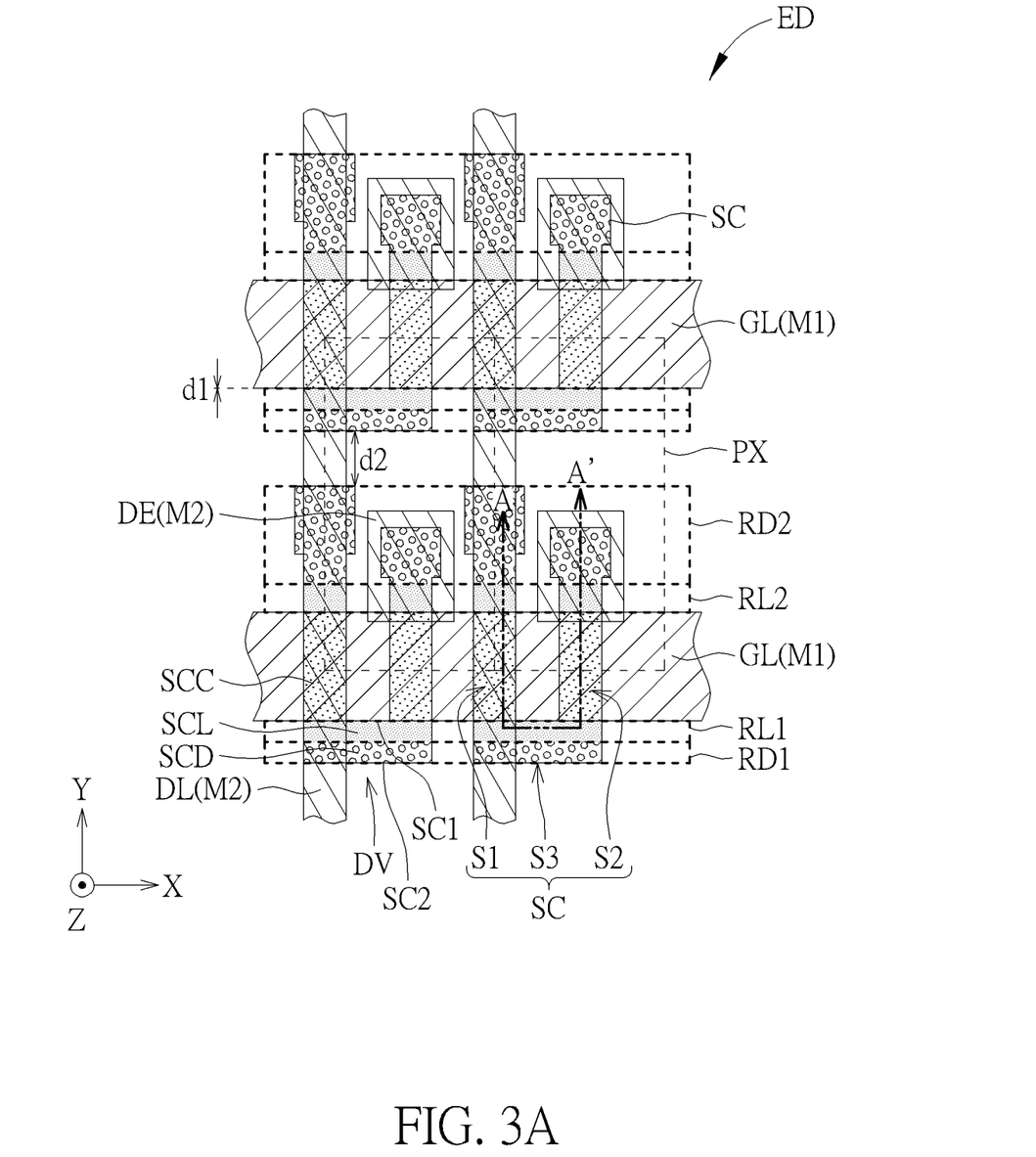
FIG. 3A is a schematic partial top view of the electronic device according to a second embodiment of the present disclosure.

Referring to FIG. 3A, FIG. 3A is a schematic partial top view of the electronic device according to a second embodiment of the present disclosure. The electronic device ED in FIG. 3A is different from FIG. 1A in that the inner edge SC1 of the third portion S3 close to the corresponding scan line GL aligns with the lower side of the scan line GL. That is, the distance d1 between the inner edge SC1 and the scan line GL is 0 μm. In some embodiments, the distance d1 between the saddle point P1 of the inner edge SC1 and the scan line GL is 0 μm, but the present disclosure is not limited thereto. Under this design, the third portion S3 of the semiconductor layer SC adjoins the lower edge of the scan line GL in the top view, thus increasing the distance d2 between the lower edge of the semiconductor layer SC in the pixel PX and the semiconductor layer SC of another pixel PX below the pixel PX, and the advantages thereof include improving the aperture ratio of the pixel PX. Similar to the embodiment shown in FIG. 1A, a portion of the third portion S3 (the portion close to the scan line GL in the second direction Y) is a lightly doped region SCL, which corresponds to the lightly doped predetermined region RL1, while another portion of the third portion S3 (the portion farther from the scan line GL in the second direction Y) is a heavily doped region SCD. The cross-sectional structure of the electronic device ED corresponding to line A-A' in FIG. 3A may be referred to FIG. 2 and is not repeated again.

Figure 3B:
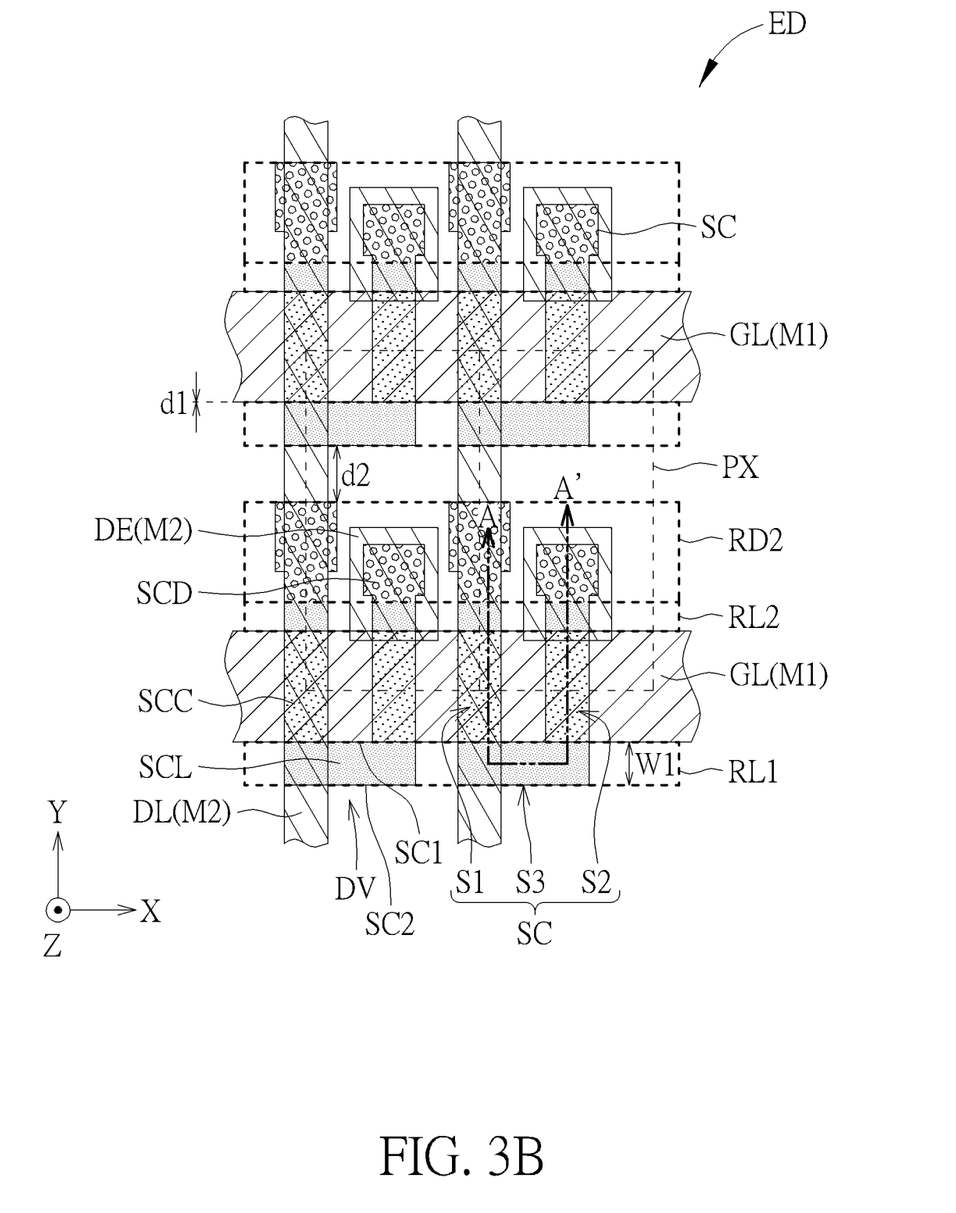
FIG. 3B is a schematic partial top view of a variation of the electronic device according to the second embodiment of the present disclosure.

Referring to FIG. 3B, FIG. 3B is a schematic partial top view of a variation embodiment of the electronic device according to the second embodiment of the present disclosure. The variation embodiment shown in FIG. 3B is different from FIG. 3A in that the electronic device ED may not have a heavily doped predetermined region RD1 and the lightly doped predetermined region RL1 may have a greater width W1, such that the third portion S3 is completely located in the lightly doped predetermined region RL1. That is, the whole third portion S3 is a lightly doped region SCL, and the portion of the semiconductor layer SC located between two undoped regions SCC (or gates GE) does not have a heavily doped region SCD. The cross-sectional structure of the electronic device ED corresponding to line A-A' in FIG. 3A may be referred to FIG. 2 and is not repeated again.

Figure 4A:
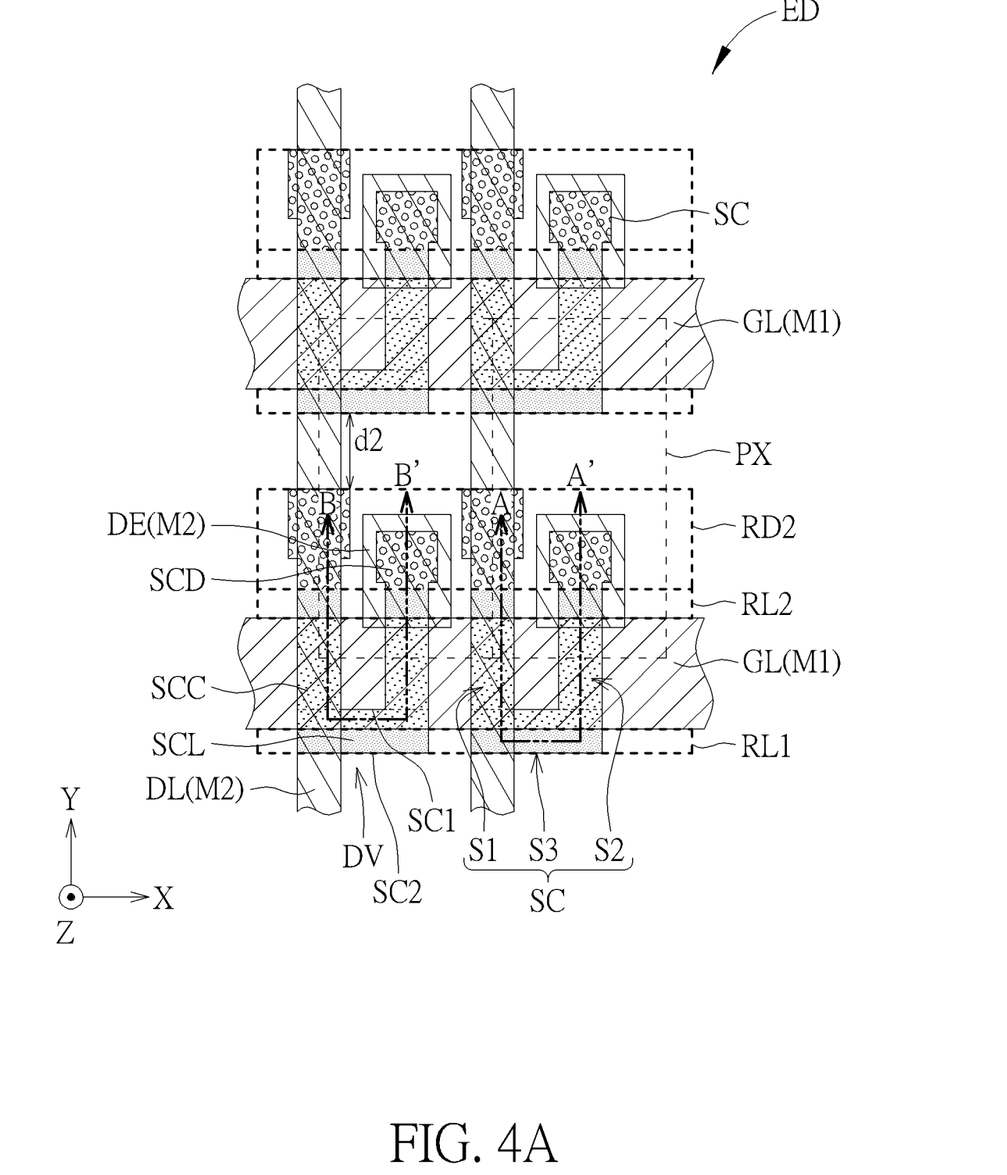
FIG. 4A is a schematic partial top view of the electronic device according to a third embodiment of the present disclosure.
Figure 4B:
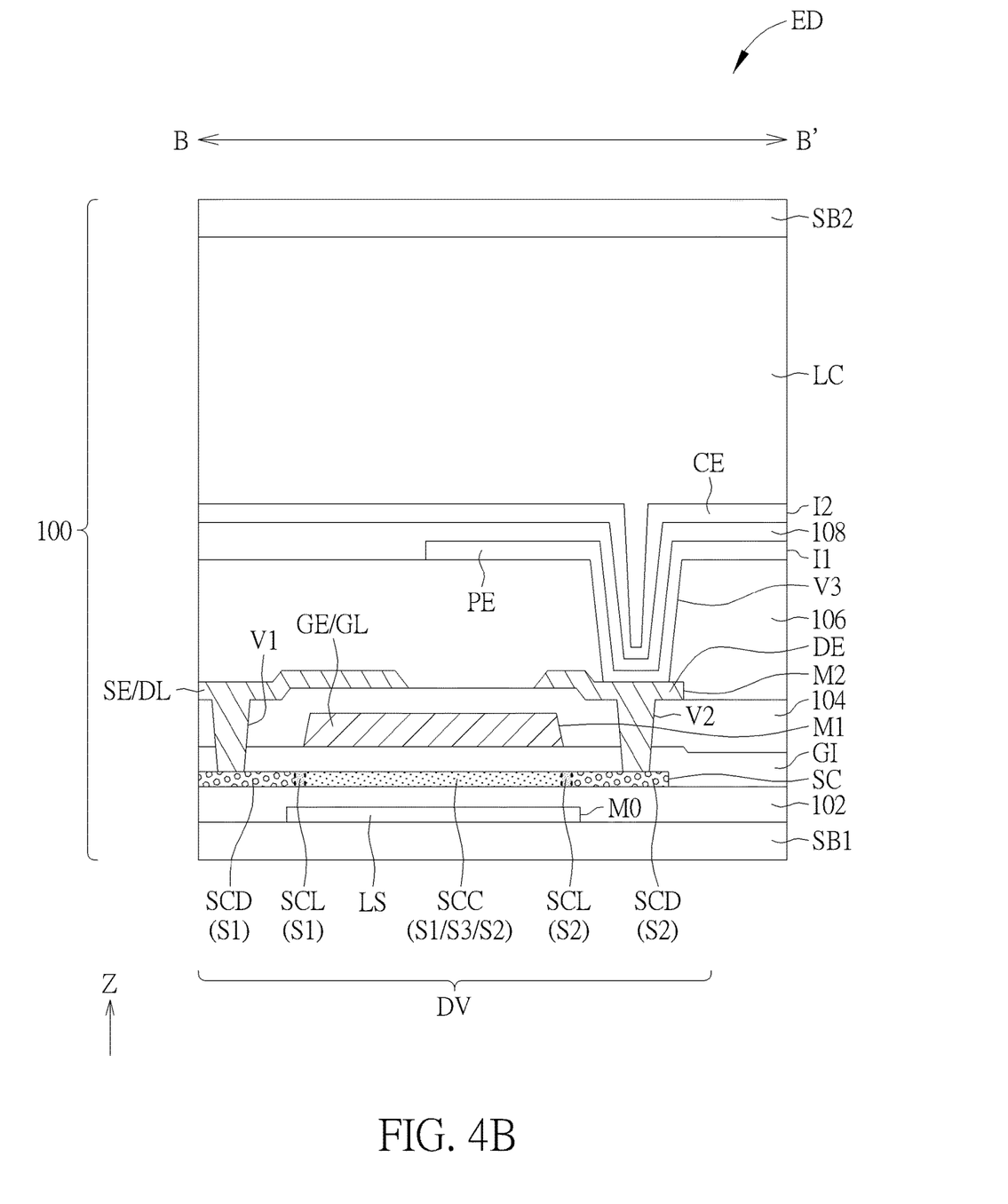
FIG. 4B is a schematic partial cross-sectional view of the electronic device along line B-B' of FIG. 4A of the present disclosure.

Referring to FIG. 4A and FIG. 4B, FIG. 4A is a schematic partial top view of the electronic device according to a third embodiment of the present disclosure, and FIG. 4B is a schematic partial cross-sectional view of the electronic device along line B-B' of FIG. 4A of the present disclosure. The cross-sectional structure of the electronic device ED corresponding to line A-A' in FIG. 4A may be referred to FIG. 2. The electronic device ED of the embodiment shown in FIG. 4A is different from the FIG. 1A in that the inner edge SC1 of the third portion S3 close to the corresponding scan line GL is overlapped with the scan line GL and the inner edge SC1 of the third portion S3 is located between the upper edge and the lower edge of the scan line GL. That is, a portion of the third portion S3 overlaps the scan line GL. The portion of the third portion S3 overlapping the scan line GL is an undoped region SCC, while the portion of the third portion S3 without overlapping the scan line GL is a lightly doped region SCL, which corresponds to the lightly doped predetermined region RL1. The third portion S3 does not have a heavily doped region SCD. In the embodiment shown in FIG. 4A, the design that the third portion S3 partially overlaps the scan line GL may increase the distance d2 between the semiconductor layers SC in adjacent pixels PX, so as to improve the aperture ratio of the pixels PX and process feasibility.

Figure 5:
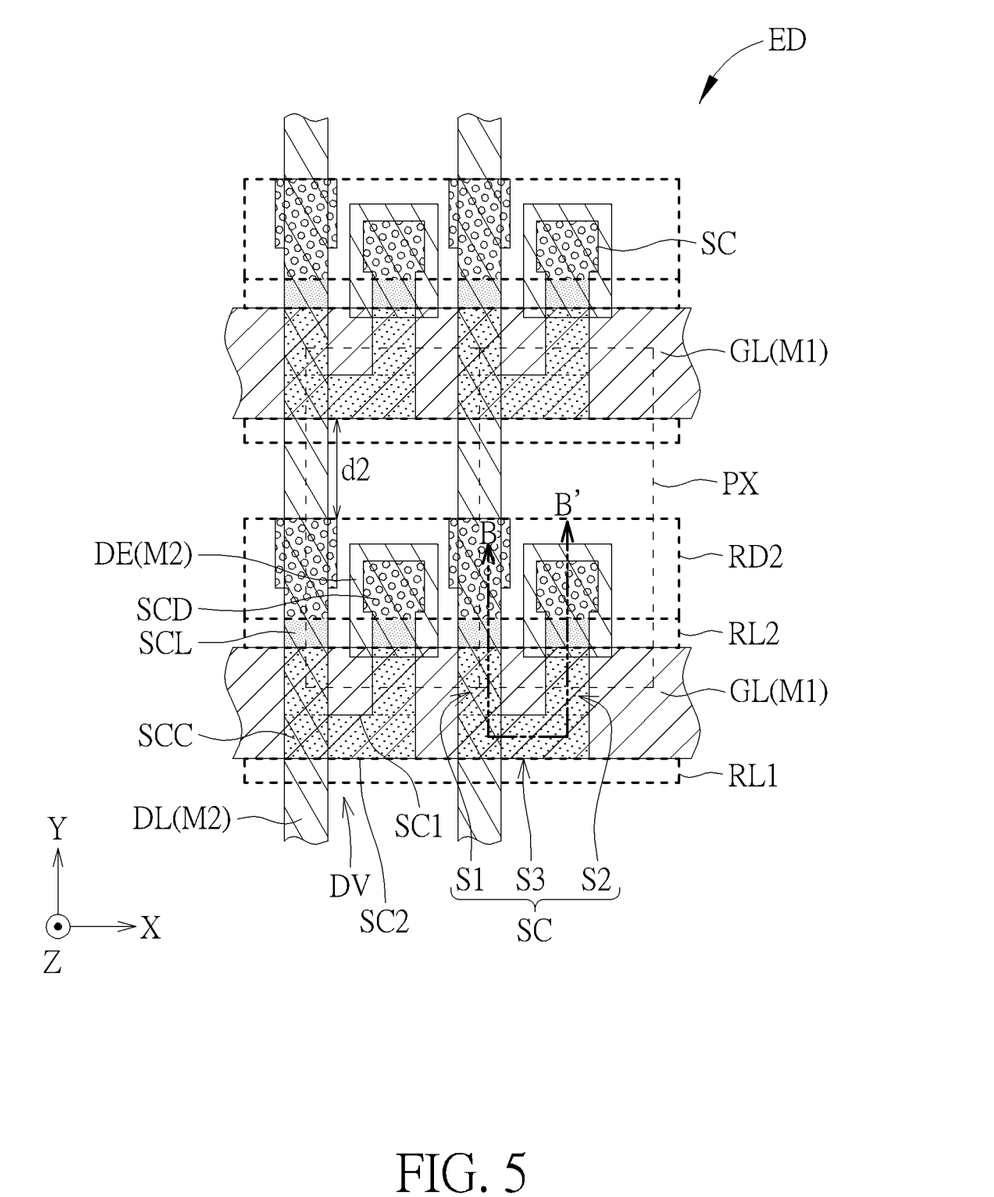
FIG. 5 is a schematic partial top view of the electronic device according to a fourth embodiment of the present disclosure.

Referring to FIG. 5, FIG. 5 is a schematic partial top view of the electronic device according to a fourth embodiment of the present disclosure, wherein the partial sectional structure of the electronic device shown in FIG. 5 along line B-B' may refer to FIG. 4B. The electronic device ED shown in FIG. 5 is different from the electronic device in FIG. 4A in that the third portion S3 is completely covered by the scan line GL. That is, the third portion S3 is completely overlapped with the scan line GL, such that the whole third portion S3 is an undoped region SCC and does not have a lightly doped region SCL or a heavily doped region SCD. The above design may further increase the distance d2 between the semiconductor layers SC in adjacent pixels PX to improve the aperture ratio of pixels PX and process feasibility. Alternatively, when the overall size of the pixel PX is reduced, the above design may maintain the pixel PX with a greater aperture ratio as much as possible.

Figure 6A:
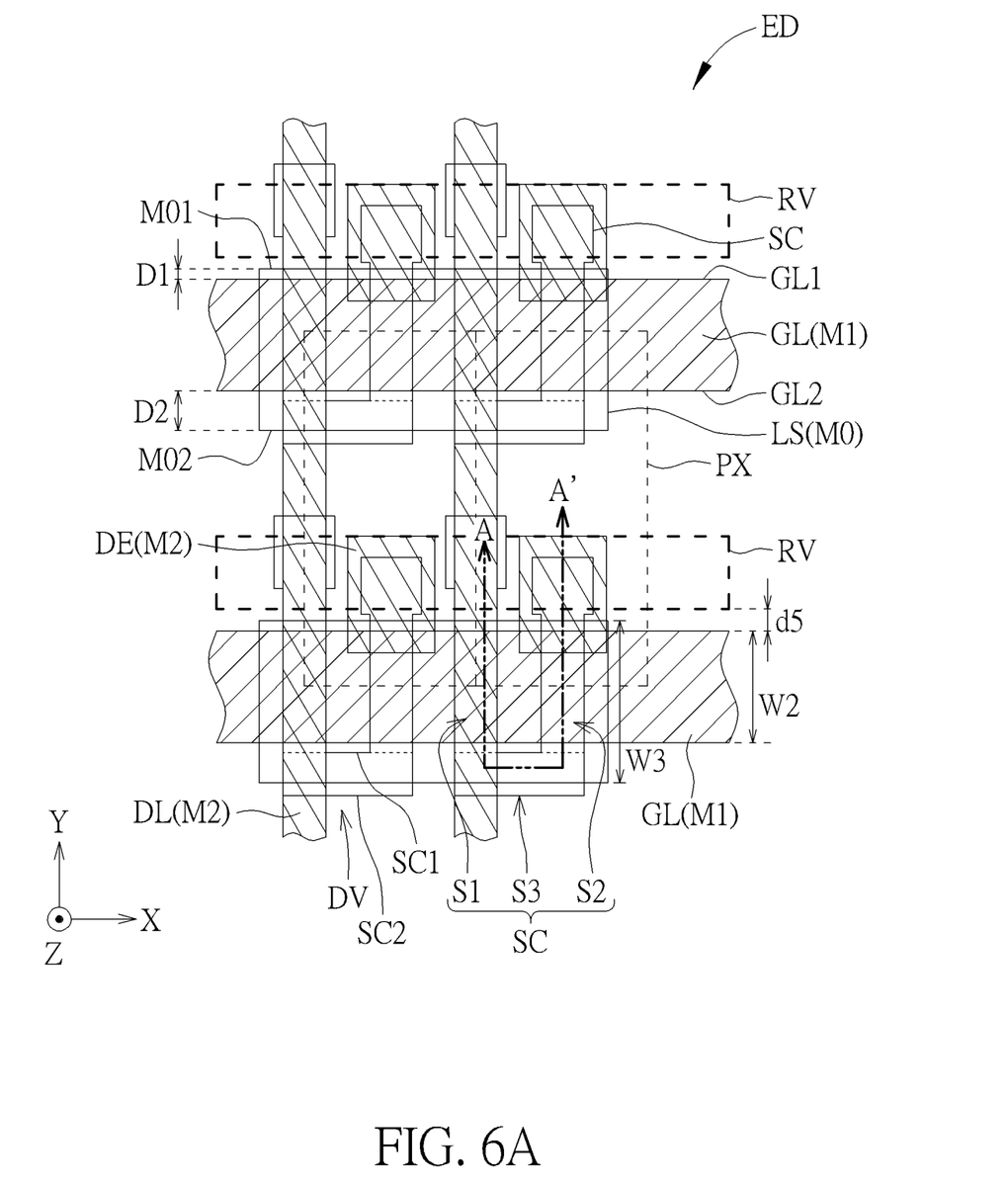
FIG. 6A is a schematic partial top view of the electronic device according to a fifth embodiment of the present disclosure.
Figure 6B:
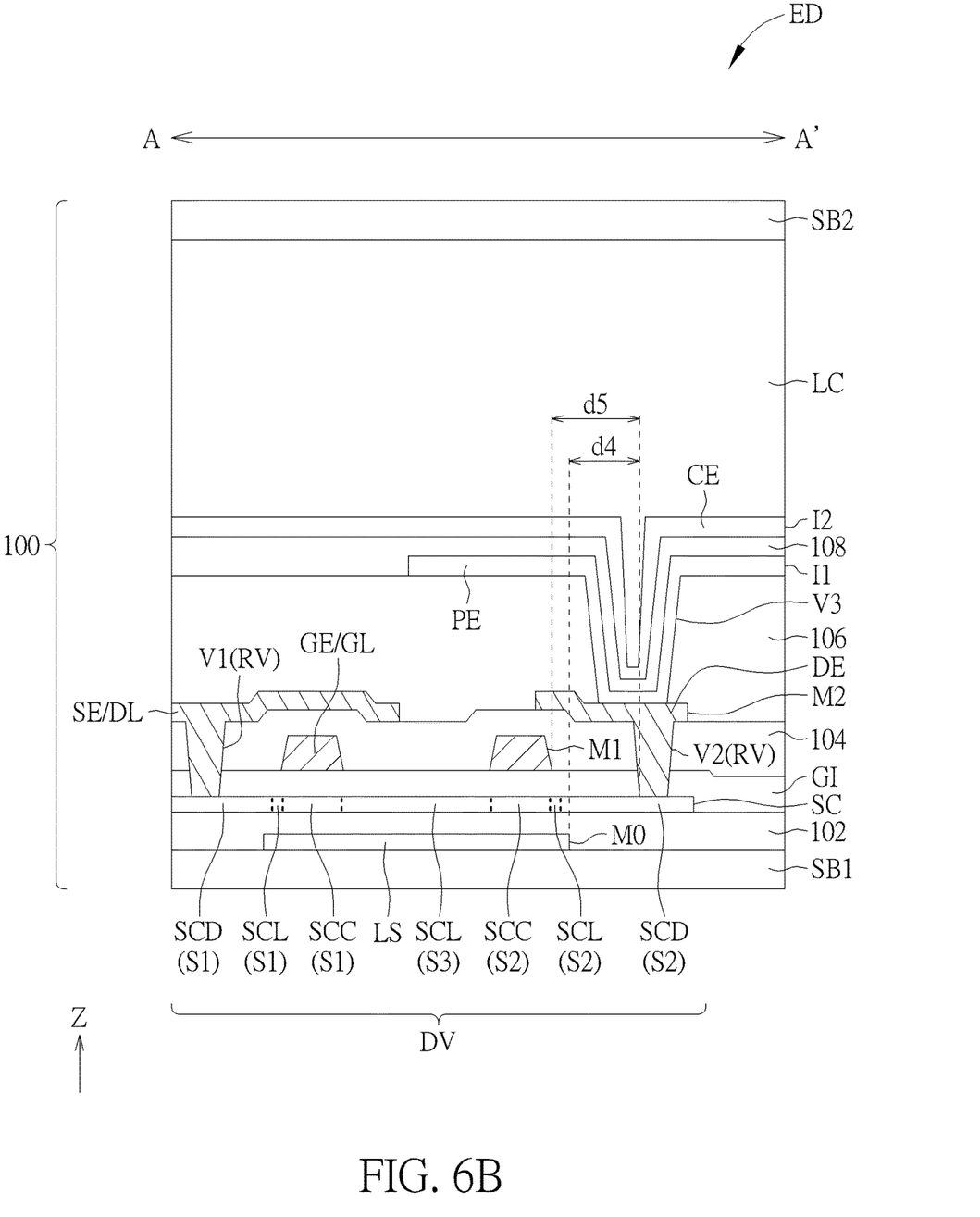
FIG. 6B is a schematic partial cross-sectional view of the electronic device along line A-A' of FIG. 6A of the present disclosure.

Referring to FIG. 6A and FIG. 6B, FIG. 6A is a schematic partial top view of the electronic device according to a fifth embodiment of the present disclosure, and FIG. 6B is a schematic partial cross-sectional view of the electronic device along line A-A' of FIG. 6A of the present disclosure. In the partial top view of FIG. 6A, the top view patterns of the light shielding layer M0 and the contact hole RV of the electronic device ED are shown. The electronic device ED includes a contact hole RV, and the contact hole V1 and the contact hole V2 are portions of the contact hole RV. The contact hole RV may be formed by etching the insulating layer 104 and the insulating layer GI to expose the semiconductor layer SC, such that the source SE and the drain DE may be electrically connected to the heavily doped regions SCD of the semiconductor layer SC through the contact hole RV. In the embodiment shown in FIG. 6A, the contact hole RV is a laterally extending region, but this design is only an example. In some embodiments, the contact hole RV may be a plurality of regions separated from each other, which respectively correspond to the predetermined regions of each drain DE and source SE. The light shielding layer M0 includes a light shielding element LS, and the light shielding element LS may have a rectangular pattern or a horizontally extending strip pattern in the top view along the normal direction Z of the electronic device ED. For example, the light shielding element LS may generally correspond to the scan line GL but may have a greater width than that of the scan line GL, but not limited thereto. As shown in FIG. 6A, the width W2 of the scan line GL in the second direction Y may be slightly smaller than the width W3 of the light shielding element LS in the second direction Y. The light shielding element LS at least partially overlaps the semiconductor layer SC. For example, the light shielding element LS at least overlaps the portion of the semiconductor layer SC corresponding to the scan line GL, but not limited thereto. The light shielding element LS includes a first edge M01 and a second edge M02. The upper edge and lower edge of the scan line GL are defined as a third edge GL1 and a fourth edge GL2, respectively. The first edge M01 of the light shielding element LS is adjacent to the third edge GL1, and a first distance D1 is between the first edge M01 and the third edge GL1. The second edge M02 is adjacent to the fourth edge GL2 and a second distance D2 is between the second edge M02 and the fourth edge GL2. The first distance D1 is different from the second distance D2. As shown in FIG. 6A, the fourth edge GL2 of the scan line GL is closer to the inner edge SC1 of the third portion S3 of the semiconductor layer SC compared to the third edge GL1, and the first distance D1 is less than the second distance D2. That is, the distance between the first edge M01 of the light shielding element LS and the scan line GL is less than the distance between the second edge M02 and the scan line GL, and the upper edge and lower edge of the light shielding element LS are asymmetrical with respect to the scan line GL. The first edge M01 of the light shielding element LS is closer to the scan line GL and the first edge M01 and the contact hole RV have a spacing d4 therebetween (as shown in FIG. 6B). That is, the first edge M01 is located between the upper edge of the scan line GL1 (i.e., the third edge GL1) and the lower boundary of the contact hole RV in the second direction Y. Therefore, the contact hole RV does not overlap the light shielding layer M0. That is, the contact hole V2 may not overlap the light shielding layer M0 or the light shielding element LS. In the case of the pixel PX having a smaller size (e.g., applying to a high-resolution device such as a VR device), the contact hole RV is closer to the scan line GL. Nevertheless, the risk of short circuit caused by the electrical connection between the second conductive layer M2 and the light shielding layer M0 can be reduced when the first distance D1 is designed to be less than the second distance D2 in this embodiment. In addition, as shown in FIG. 6A and FIG. 6B, there is a spacing d5 existing between the lower boundary of the contact hole RV and the third edge GL1 of the scan line GL. That is, the contact hole RV may not overlap the scan line GL. The above design that the contact hole RV does not overlap the light shielding layer M0 or the scan line GL may be applied to other embodiments or variations of the present disclosure, and is not repeated in detail.

According to the present disclosure, the semiconductor layer is close to or partially overlaps the scan line at the turning point (i.e., the third portion of the semiconductor layer), and therefore at least a portion of the third portion is a lightly doped region. Alternatively, when the turning point of the semiconductor layer is completely covered or overlapped by the scan line, the whole third portion of the semiconductor layer may be an undoped region without any lightly doped region or heavily doped region. Under the above design, the distance between the semiconductor layers of adjacent pixels may be increased and the aperture ratio of pixel may be improved. Even in the case that the pixel size is very small, it may still have good performance. On the other hand, the design that the light shielding layer does not overlap the contact hole may solve the problem of short circuit caused by the contact hole exposing the light shielding layer, so as to improve the product yield.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
    a substrate;
    a data line disposed on the substrate and extending along a first direction;
    a scan line disposed on the substrate and extending along a second direction, wherein the second direction is not parallel with the first direction;
    a drain disposed on the substrate; and
    a semiconductor layer disposed on the substrate, wherein the semiconductor layer comprises a first portion connected to the data line, a second portion connected to the drain, and a third portion connected between the first portion and the second portion, the first portion and the second portion extend along the first direction, the third portion extends along the second direction and has a first end connected to a lower side of the first portion in a top view and a second end connected to a lower side of the second portion in the top view, the third portion has an inner edge close to the scan line, the inner edge is parallel to a side edge of the scan line, and a distance between the inner edge and the side edge of the scan line is 0 μm such that the inner edge of the third portion is aligned with the side edge of the scan line, wherein the scan line at least partially overlaps the semiconductor layer, at least one portion of the third portion comprises at least one of IIIA group element and VA group element, and a doping concentration of the at least one of IIIA group element and VA group element is greater than 0 and less than or equal to $10^{16}$ atoms/cm³.

2. The electronic device of claim 1, wherein the at least one portion of the third portion is a lightly doped region, and a rest portion of the third portion is a heavily doped portion that comprises at least one of IIIA group element and VA group element with a doping concentration greater than $10^{16}$ atoms/cm³.

3. The electronic device of claim 1, wherein the third portion is entirely a lightly doped region with the doping concentration of the at least one of IIIA group element and VA group element greater than 0 and less than or equal to $10^{16}$ atoms/cm³.

4. The electronic device of claim 1, further comprising:
a light shielding layer disposed between the substrate and the semiconductor layer, wherein the light shielding layer at least partially overlaps the semiconductor layer,
wherein the light shielding layer has a first edge and a second edge, the scan line has a third edge and a fourth edge, the first edge is adjacent to the third edge and a first distance is between the first edge and the third edge, the second edge is adjacent to the fourth edge and a second distance is between the second edge and the fourth edge, and the first distance is different from the second distance.

5. The electronic device of claim 4, wherein the fourth edge is adjacent to the inner edge, and the first distance is less than the second distance.

6. The electronic device of claim 4, further comprising:
an insulating layer disposed on the semiconductor layer, wherein the insulating layer comprises a contact hole; and
a transparent electrode electrically connected to the semiconductor layer through the contact hole, wherein the contact hole does not overlap the light shielding layer.

7. The electronic device of claim 6, wherein the drain is electrically connected to the semiconductor layer through the contact hole.

8. The electronic device of claim 6, further comprising another insulating layer disposed on the drain, wherein the another insulating layer comprises another contact hole exposing a portion of the drain, and the transparent electrode is electrically connected to the drain through the another contact hole.

9. The electronic device of claim 8, further comprising a common electrode disposed on the transparent electrode, and a portion of the common electrode is disposed in the another contact hole.

10. The electronic device of claim 8, wherein the contact hole in the insulating layer is partially overlapped with the another contact hole of the another insulating layer.

11. The electronic device of claim 4, wherein the light shielding layer includes a light shielding element, a width of the light shielding element in the first direction is greater than a width of the scan line in the first direction.

12. The electronic device of claim 1, wherein the doping concentration of the at least one of IIIA group element and VA group element in the at least one portion of the third portion ranges from $10^{10}$ to $10^{16}$ atoms/cm³.

13. The electronic device of claim 1, wherein the semiconductor layer includes three lightly doped regions separated from each other.

14. The electronic device of claim 13, wherein the scan line extends across the semiconductor layer, and one of the three lightly doped regions and other two of the three lightly doped regions are disposed at two opposite sides of the scan line.

15. An electronic device, comprising:
a substrate;
a data line disposed on the substrate and extending along a first direction;
a drain disposed on the substrate;
a scan line disposed on the substrate and extending along a second direction, wherein the second direction is different from the first direction; and
a semiconductor layer disposed on the substrate, wherein the semiconductor layer comprises a first portion connected to the data line, a second portion connected to the drain, and a third portion connected between the first portion and the second portion, the first portion and the second portion extend along the first direction, and the third portion extends along the second direction,
wherein one portion of the third portion comprises at least one of IIIA group element and VA group element, and a doping concentration of the at least one of IIIA group element and VA group element is greater than 0 and less than or equal to $10^{16}$ atoms/cm³,
wherein a rest portion of the third portion is an undoped region and overlaps the scan line, the one portion of the third portion does not overlap the scan line, and a width of the rest portion of the third portion is equal to a width of the one portion of the third portion in the second direction.

16. The electronic device of claim 15, wherein the doping concentration of the at least one of IIIA group element and VA group element in the one portion of the third portion ranges from $10^{10}$ to $10^{16}$ atoms/cm³.

* * * * *